US012796517B2

(12) United States Patent
Uzoh et al.

(10) Patent No.: US 12,796,517 B2
(45) Date of Patent: Nov. 10, 2026

(54) HYBRID BONDING METHODS AND DEVICE ASSEMBLIES FORMED USING THE SAME

(71) Applicant: Adeia Semiconductor Bonding Technologies, Inc., San Jose, CA (US)

(72) Inventors: Cyprian Emeka Uzoh, San Jose, CA (US); Gaius Gillman Fountain, Jr., Youngsville, NC (US)

(73) Assignee: Adeia Semiconductor Bonding Technologies, Inc., San Jose, CA (US)

( * ) Notice: Subject to any disclaimer, the term of this patent is extended or adjusted under 35 U.S.C. 154(b) by 353 days.

(21) Appl. No.: 18/379,053

(22) Filed: Oct. 11, 2023

(65) Prior Publication Data

US 2025/0006672 A1 Jan. 2, 2025

Related U.S. Application Data

(60) Provisional application No. 63/524,392, filed on Jun. 30, 2023.

(51) Int. Cl.
*H10W 72/00* (2026.01)

(52) U.S. Cl.
CPC .... *H10W 72/019* (2026.01); *H10W 72/01935* (2026.01); *H10W 72/01938* (2026.01); *H10W 72/01953* (2026.01)

(58) Field of Classification Search
CPC ............ H01L 24/03; H01L 2224/0345; H01L 2224/03616; H01L 2924/15798; H01L 2224/0384; H01L 2224/05022; H01L 2224/05082; H01L 2224/05562; H01L 2224/05567; H01L 2224/05573; H01L 2224/0603; H01L 2224/08112; H01L 2224/08147; H01L 2224/08148; H01L 24/80; H01L 2224/80895; H01L 2224/80896; H10W 72/019; H10W 72/01935; H10W 72/01938; H10W 72/01953

See application file for complete search history.

(56) References Cited

U.S. PATENT DOCUMENTS

| | | | | |
|---|---|---|---|---|
| 11,552,041 | B2 | 1/2023 | Fountain et al. | |
| 2020/0051937 | A1 * | 2/2020 | Uzoh | H01L 24/08 |
| 2021/0098359 | A1 | 4/2021 | Vreeland et al. | |

OTHER PUBLICATIONS

International Search Report and Written Opinion received for PCT Patent Application No. PCT/US24/35889, mailed on Oct. 28, 2024, 14 pages (14 pages of Original Document).

* cited by examiner

*Primary Examiner* — Fernando L Toledo
*Assistant Examiner* — Adam S Bowen
(74) *Attorney, Agent, or Firm* — HG LAW LLP

(57) ABSTRACT

A first conductive feature of a first substrate is bonded to a second conductive feature of a second substrate. The first conductive feature is formed by depositing a conductive base layer on the first substrate, the first substrate having an opening formed therein, recessing the conductive base layer in the opening, and depositing a conductive surface layer on the recessed conductive base layer. Hybrid bonding of the first substrate to the second substrate is performed without use of an intervening adhesive to connect the first conductive feature and the second conductive feature.

20 Claims, 4 Drawing Sheets

HYBRID BONDING METHODS AND DEVICE ASSEMBLIES FORMED USING THE SAME

CROSS-REFERENCE TO RELATED APPLICATION

This application claims the benefit of U.S. Provisional Patent Application No. 63/524,392, filed Jun. 30, 2023, which is hereby incorporated by reference herein in its entirety.

FIELD

The present disclosure relates to advanced packaging of semiconductor devices, and in particular, to hybrid bonding methods and device assemblies formed using the same.

SUMMARY

Embodiments herein provide for improved surface characteristics of the conductive features used to form interconnects between devices via hybrid bonding. Advantageously, the improved surface characteristics may be used to reduce bonding defects at the bonding interface.

One general aspect includes a method of forming electrical connections between first and second substrates. The method includes forming the first conductive feature by depositing a conductive base layer on the first substrate, the first substrate having an opening formed therein, recessing the conductive base layer in the opening, and depositing a conductive surface layer on the recessed conductive base layer. The method further includes hybrid bonding the first substrate to the second substrate without use of an intervening adhesive to connect the first conductive feature and the second conductive feature.

In some embodiments, an average grain size of the conductive base layer is larger than an average grain size of the conductive surface layer.

Various embodiments disclosed herein relate to bonded structures in which two or more elements are directly bonded to one another without an intervening adhesive (referred to herein as “direct bonding”, or “directly bonded”). In some embodiments, direct bonding can involve the bonding of a single material on the first of the two or more elements and a single material on a second one of the two more elements, where the single materials on the different elements may or may not be the same. Direct bonding can also involve bonding of multiple materials on one element to multiple materials on the other element (e.g., hybrid bonding). As used herein, the term “hybrid bonding” refers to a species of direct bonding in which both i) nonconductive features directly bond to nonconductive features, and ii) conductive features directly bond to conductive features. In some embodiments, recessing the conductive base layer includes removing an overburden of the conductive base layer using a first polishing process. In some embodiments, the method further includes, prior to hybrid bonding, removing an overburden of the conductive surface layer using a second polishing process that is different from the first polishing process. In some embodiments, the first polishing process uses a polishing pad with a first hardness, and the second polishing process uses a polishing pad with a second hardness that is less than the first hardness.

In some embodiments, the conductive base layer is recessed by a depth from about 27 nm to about 500 nm, or from about 100 nm to about 500 nm. In some embodiments, the conductive base layer is recessed by a depth of less than about 25 nm.

In some embodiments, the conductive base layer is formed using an electroplating process. In some embodiments, the conductive surface layer is deposited using a physical vapor deposition (PVD) process. In some embodiments, the first substrate is maintained at a temperature less than about 100° C. during the PVD process, such as less than about 50° C. In some embodiments, conductive surface layer has a surface roughness of less than about 1 nm root mean square (RMS).

In some embodiments, prior to the hybrid bonding, the first conductive feature is substantially co-planar with a field surface of the first substrate. In some embodiments, prior to the hybrid bonding, the first conductive feature protrudes above the field surface of the first substrate and the second conductive feature is recessed from a field surface of the second substrate. In some embodiments, the second conductive feature is formed by a substantially similar method as used to form the first conductive feature. In some embodiments, the second conductive feature is formed using a single conductive layer, where the single conductive layer is formed using substantially the same method as used to form the conductive base layer on the first substrate. In some embodiments, the hybrid bonding comprises directly bonding the first conductive feature to the single conductive layer of the second conductive feature.

In some embodiments, the hybrid bonding includes contacting the first substrate and the second substrate at ambient temperature to form a workpiece and heating the workpiece to a temperature less than about 300° C.

In some embodiments, the first conductive feature has a width greater than about 0.1 microns and an aspect ratio less than about 15. In some embodiments, the first conductive feature has a width greater than about 0.5 microns and an aspect ratio less than about 15. In some embodiments, the first conductive feature has a width greater than about 5 microns and an aspect ratio less than about 5. In some embodiments, the first conductive feature has a width greater than about 5 microns and an aspect ratio less than about 2. In some embodiments, the first conductive feature has a width greater than about 10 microns and an aspect ratio less than about 2. In some embodiments, the first substrate comprises a plurality of first conductive features having at least two different widths.

In another embodiment, a method of forming electrical connections between a first substrate and a second substrate is provided. The method generally includes forming a first conductive feature by depositing a conductive layer on the first substrate, the first substrate having an opening formed therein, removing an overburden of the conductive layer by sequentially polishing the substrate using a first polishing pad having a first hardness and a second pad having a second hardness less than the first hardness. In some embodiments, the deposited or coated conductive layer may be annealed at a temperature lower than the bonding temperature of the substrates before removing the overburden of the conductive layer by sequentially polishing the substrate using the first polishing pad having the first hardness and the second pad having the second hardness less than the first hardness. The method further includes hybrid bonding the first substrate to the second substrate to connect the first conductive feature and the second conductive feature without use of an intervening adhesive. In some embodiments, the first conductive feature has a surface roughness of less than about 1 nm root mean square prior to the hybrid bonding. In some embodiments, prior to the hybrid bonding, the first conductive feature protrudes above the field surface of the first substrate, and the second conductive feature is recessed from the field surface of the second substrate.

In some embodiments, the second conductive feature has a surface roughness different from a surface roughness of the first conductive feature. In some embodiments, the second conductive feature is formed by substantially the same method as the first conductive feature.

In some embodiments, hybrid bonding includes contacting the first substrate and second substrate at ambient temperature to form a workpiece, and heating the workpiece to a temperature less than about 400° C., or less than about 300° C., to connect the first conductive feature and the second conductive feature. The first conductive feature may have a width greater than about 0.1 microns and an aspect ratio less than about 15. The first conductive feature may have a width greater than about 0.5 microns and an aspect ratio less than about 15. The first conductive feature may have a width greater than about 1 micron and an aspect ratio less than about 15. The first conductive feature may have a width greater than about 5 microns and an aspect ratio less than about 2. The first conductive feature may have a width greater than about 10 microns and an aspect ratio less than about 2. The first substrate may comprise a plurality of first conductive features having at least two different widths.

Another general aspect includes a device assembly comprising a first device bonded to a second device. In some embodiments, the conductive features of one or both of the first and second device have a first average grain size at the bonding interface and a second average grain size distal from the bonding interface, where the first average grain size is less than the second average grain size.

BRIEF DESCRIPTION OF THE DRAWINGS

The above and other objects and advantages of the disclosure will be apparent upon consideration of the following detailed description, taken in conjunction with the accompanying drawings.

Figure 1A:
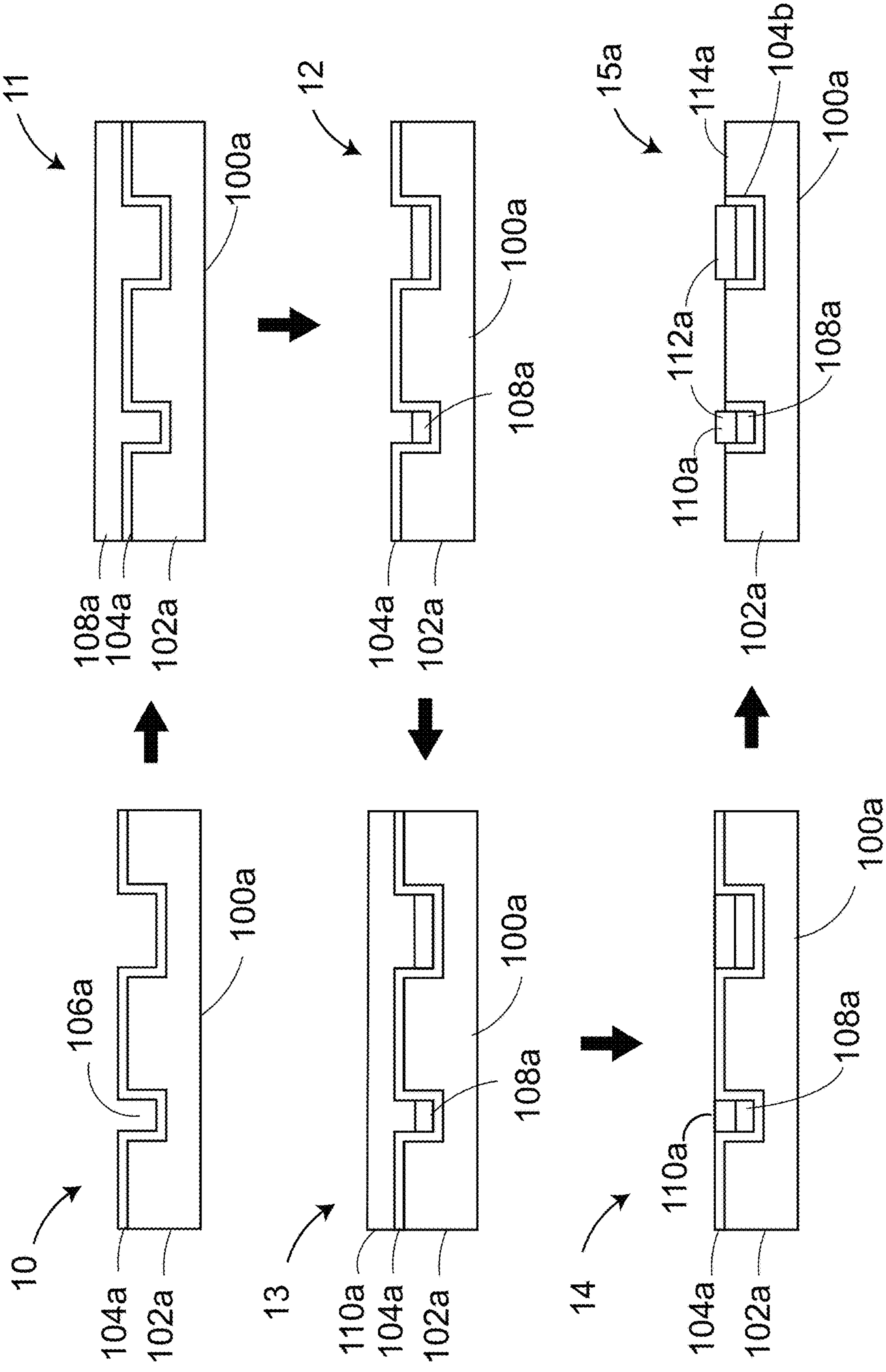
FIGS. 1A-1B schematically illustrate aspects of a method of preparing a substrate for hybrid bonding, according to an embodiment.

The figures herein depict various embodiments of the disclosure for purposes of illustration only. It will be appreciated that additional or alternative structures, assemblies, systems, and methods may be implemented within the principles set out by the present disclosure.

DETAILED DESCRIPTION

Embodiments herein provide for improved surface characteristics of the conductive features used to form interconnects between devices via hybrid bonding. The improved surface characteristics may include reduced grain size, roughness, the range of the roughness, and defectivity (e.g., micro scratches) at the surface of one or both of the to-be-bonded conductive features when compared to conventional processing methods.

As described below, semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" may be used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between layers and other features described below. Unless the relationship is otherwise defined, terms such as "above," "over," "upper," "upwardly," "outwardly," "on," "below," "under," "beneath," "lower," and the like are generally made with reference to the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements.

The hybrid bonding methods described herein generally include forming conductive features in the dielectric surfaces of the to-be-bonded substrates, activating the surfaces to open chemical bonds in the dielectric material, and terminating the surfaces with a desired species. In some embodiments, activating the surface may weaken chemical bonds in the dielectric material. Activating and terminating the surfaces with a desired species may include exposing the surfaces to radical species formed in a plasma. In some embodiments, the plasma is formed using a nitrogen-containing gas, e.g., N2, or forming gas, and the terminating species includes nitrogen and hydrogen. In some embodiments, the surfaces may be activated using a wet cleaning process, e.g., by exposing the surfaces to aqueous solutions. In some embodiments, the aqueous solution is tetramethylammonium hydroxide diluted to a certain degree or percentage. In some embodiments, an aqueous solution may be ammonia.

Typically, the hybrid bonding methods further include aligning the substrates, and contacting the activated surfaces to form direct dielectric bonds. After the dielectric bonds are formed, the substrates may be heated to a temperature of 150° C. or more and maintained at the elevated temperature for a duration of about 1 hour or more, such as between 8 and 24 hours, to form direct metallurgical bonds between the metal features.

Generally, the conductive features described herein are formed using a damascene process, where one or more layers of conductive material are deposited into openings formed in a substrate and onto the surrounding "field" (exposed) surface surrounding the openings. An "overburden" (excess) of the conductive material may then be removed from the field surface to form the conductive features which, as described below, may be recessed from, protrude above, or be coplanar with the field surface of a surrounding dielectric layer such as further described in the methods set forth below. In some embodiments, a non-damascene process may be applied to form one or more layers described herein. In some embodiments, a barrier or adhesion layer and conductive material may be coated over the substrate. In some embodiments, the barrier or adhesion layer may be optional. The coated layer may be patterned and portions of the conductive material and barrier layer may be selectively etched off. The cleaned substrate may be coated with a suitable dielectric layer. The dielectric layer may be planarized to form a bonding surface comprising exposed conductive material and the surrounding dielectric layer. Depending on the thickness of the coated conductive material multiple dielectric coating and planarization steps may be applied to form a smooth bonding surface.

Typically, conductive features used in hybrid bonding are formed by depositing a layer of conductive material, such as copper, on a substrate having an opening formed therein and removing an overburden of the conductive material using a chemical mechanical polishing (CMP) process. Often, the CMP uses a "hard" polishing pad, such as the IC-1000™, IC1010™, Ikonic 4100™ series, and Ikonic 4200™ polishing pads, each commercially available from Dupont Corp., headquartered in Willington DE. Generally, such "hard" polishing pads are characterized as those having a hardness of about 40 or greater on the Shore D hardness scaled while relatively soft "soft" polishing pads may include polishing pads having a surface hardness of less than about 80 Shore A, such as Ikonic 2000™ series polishing pads, also available from Dupont Corp.

Typically, hard polishing pads provide good planarization characteristics and high material removal rates but also produce higher defectivity from micro-scratches and nano-scratches when compared to CMP processes using soft polishing pads. For example, surfaces polished using hard polishing pads may have an undesirably high surface roughness variation. For example, the average roughness of the polished conductive material may be more than about 6 times the average surface roughness of the dielectric field surface. For example, the range of surface roughness of the polished conductive material may be more than about 3 times the average roughness of the polished conductive material. For example, a range may be greater than about 8 times the average surface roughness of the dielectric field surface and greater than about 10 times the average surface roughness of the conductive features. Without intending to be bound by theory, it is further believed that relatively large grain sizes of materials in the conductive feature, such as conductive features formed by electroplating and/or grain growth, contributes to greater surface roughness and surface roughness variation than found in conductive features formed using other deposition methods, such as physical vapor deposition.

Unfortunately, such defectivity and variation in surface roughness may lead to bonding defects, such as voiding at the bonding interface, that can cause device failure or reduce lifetime, thus suppressing yield and increasing costs. Accordingly, embodiments herein include polishing methods to reduce surface roughness and surface roughness variation and deposition methods to reduce average grain size at the surface of the conductive features. In some embodiments, a surface of the conductive features have a roughness range of less than about 4 times the average surface roughness of the conductive features. It is contemplated that the polishing and deposition methods may be used alone or in combination to provide an improved bonding process with reduced bonding defects and increased device yield. As used herein, the term "substrate" means and includes any wafer or article that provides a base material or supporting surface from which or upon which components, elements, devices, assemblies, modules, systems, or features of the devices described herein may be formed. The term substrate also includes "semiconductor substrates" that provide a supporting material upon which elements of a semiconductor device are fabricated or attached, and any material layers, features, electronic devices, and/or passive devices formed thereon, therein, or therethrough. The term substrate may also include glass substrates, polymeric substrates, ceramic substrates, flat panels, etc. A substrate may refer to a structure having planar conductive and nonconductive features at its bonding surface and the bonding surface adapted for hybrid bonding.

Figure 1B:
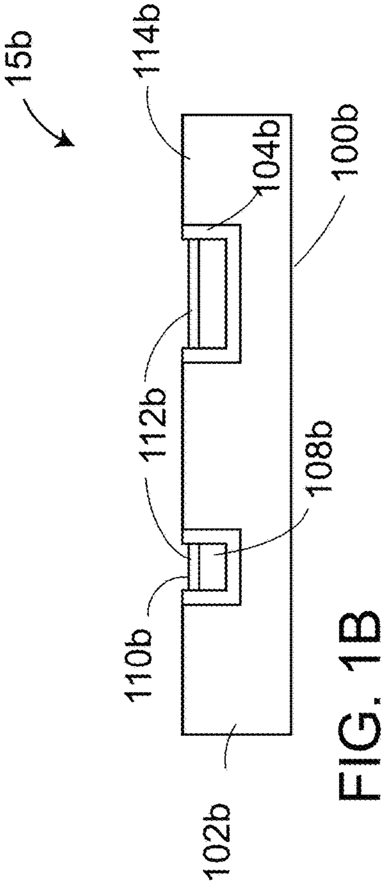
Figure 1C:
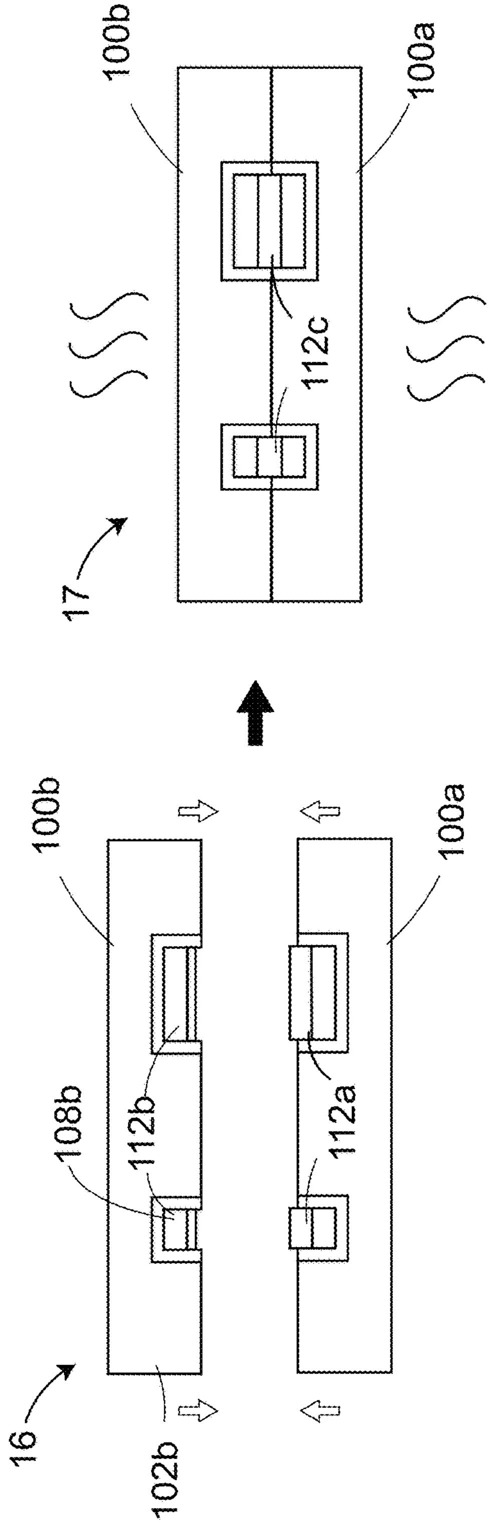
FIG. 1C schematically illustrates a hybrid bonding method using substrates prepared according to the methods described herein.

FIGS. 1A-1C collectively illustrate aspects of a hybrid bonding method, according to embodiments described herein. As shown, FIG. 1A illustrates a method of forming first conductive features **112*a* in a first substrate, FIG. 1B illustrates a second substrate 100*b* having second conductive features 112*b* formed therein, and FIG. 1C illustrates hybrid bonding the first substrate 100*a* to the second substrate 100*b***.

Turning now to FIG. 1A, at block 10, the first substrate **100*a* generally includes a dielectric layer 102*a*, e.g., SiO2, having openings 106*a* formed therein, and one or more barrier layers, e.g., Ta, TaN, TiN, and/or TiN/Ti (here shown as one barrier layer 104*a*) disposed on the dielectric layer 102*a* and lining the openings 106*a***.

At block 11, the method includes forming a conductive base layer **108*a* on the surface of the first substrate 100*a* and in the openings 106*a* formed therein, where the barrier layer 104*a* is disposed between the dielectric layer 102*a* and the conductive base layer 108*a*. In some embodiments, the conductive base layer 108*a* comprises a metal, such as copper, and may be deposited using any suitable method, such as by electroplating. In some embodiments, the conductive base layer 108*a* may be annealed, e.g., by heating the first substrate 100*a* to an annealing temperature of about 150° C. or more, for example between about 150° C. and about 250° C., or between about 150° C. and about 200° C., and maintaining the first substrate 100*a* at the annealing temperature for about 60 minutes or more, such as between about 60 minutes and about 120 minutes. In other embodiments, the annealing temperature may be less than about 150° C. In some embodiments, the conductive base layer 108*a*** may be annealed to stabilize the grain structure of the coated metal (e.g., form large grain sizes from the initially coated metal with smaller grain sizes.

At block 12, the method includes recessing the conductive base layer **108*a* in the openings 106*a*. In some embodiments, recessing the conductive base layer 108***a* includes removing an overburden of the conductive base layer 108*a* by using a chemical mechanical polishing (CMP) process. In some embodiments (as shown), the CMP process is selective to the barrier layer 104*a* and includes over polishing the conductive base layer 108*a* so that the conductive base layer 108*a* is recessed from a surface 114*a* (labeled in block 15*a*) of the surrounding dielectric layer 102*a*. In some embodiments, the polishing process may include urging the first substrate 100*a* against a hard polishing pad, as defined above, in the presence of a polishing slurry. In some embodiments, the conductive base layer 108*a* is recessed to a depth between about 0.01 to about 0.1 microns from the surface 114*a* of the dielectric layer 102*a*, or a depth from about 0.1 to about 0.5 microns, or a depth from about 100 nm to about 500 nm, or a depth from about 10 nm to about 200 nm, or a depth of less than about 25 nm. In other embodiments, the overburden is removed using a polishing process and the recessing comprises a wet etch process.

At block 13, the method includes depositing a conductive surface layer 110*a* on the recessed conductive base layer 108*a*. Typically, the conductive surface layer 110*a* is deposited using a different process than that used to form the conductive base layer 108*a*. For example, the conductive surface layer 110*a* may be deposited by a physical vapor deposition (PVD) process where the first substrate 100*a* is cooled, e.g., maintained at a temperature of less than about 100° C., concurrent with the PVD process, such as less than about 50° C., which provides for smaller grain sizes when compared to the conductive base layer 108*a* formed by the deposition and/or annealing methods described above. In such embodiments, the conductive surface layer 110*a* may be described has having a relatively "fine" grain size and the conductive base layer 108*a* may be described as having a relatively "coarse" grain size. For example, "fine" grain size copper may have grain sizes less than about 100 nm or less than about 50 nm, and "coarse" grain size copper may have grain sizes in the range of about 2 microns or more, such as 2-5 microns, or in the range of about 3 microns or more, such as 3-5 microns.

At blocks 14 and 15*a*, the method includes removing the overburdens of the conductive surface layer 110*a* and the barrier layer 104*a* by use of a second polishing process. As shown, the second polishing process includes a first polishing stage at block 14 and a second polishing stage at block 15*a*. At block 14, the first substrate 100*a* is polished using a process that provides a relatively high conductive material removal rate and a relatively low barrier material removal rate such that the conductive surface layer 110*a* is coplanar with the surrounding barrier layer 104*a* at the end of the first stage. At block 15*a*, the second polishing stage provides a relatively high barrier material removal rate and a relatively low conductive material removal rate such that the conductive surface layer 110*a* protrudes above the surrounding dielectric layer 102*a* at the end of the second stage. In other embodiments, the selectivity of the polishing process may be adjusted so that the conductive surface layer is recessed from the surrounding dielectric layer (such as shown in FIG. 1B) or is coplanar therewith (not shown). In some embodiments, the conductive features 112*a* have a surface roughness of less than about 1 nm RMS and/or a range of the surface roughness of less than about 3 nm. In some embodiments, the thickness of the conductive "fine" grained surface layer in the conductive feature 112*a* is about 0.5 micron or less.

In some embodiments, the first polishing stage uses a hard polishing pad, as defined above, and the second polishing stage uses a soft polishing pad. In some embodiments, both the first polishing stage and the second polishing stage use a soft polishing pad. In some embodiments, one or both polishing stages may urge the first substrate 100*a* against the polishing pad with a downward force of about 2.5 psi or less, or of about 1.5 psi or less, or of about 0.5 psi or less. In some embodiments, polishing slurries used at one or both of polishing stages may have an abrasive concentration of less than about 1% by volume. In some embodiments, the abrasive comprises colloidal silicon or colloidal slurry diluted to a certain degree or percentage with abrasive concentration less than 0.5%.

In some embodiments, the method includes removing an overburden of the barrier layer 104*a* using a reactive ion etching (RIE) process. In some embodiments, the RIE process selectively removes a portion of the dielectric layer 102*a* so that the conductive feature 112*a* protrudes thereabove.

As shown, the conductive features 112*a* are of at least two different widths where one or more of the conductive features 112*a* may have a width greater than about 0.1 microns, or greater than about 0.5 microns, or greater than about 5 microns, or greater than about 10 microns and/or an aspect ratio less than about 15, or less than about 12, or less than about 5, or less than about 2, and other ones of the conductive features may have a variation in width by a factor of about 10 or more.

FIG. 1B illustrates a second substrate 100*b* with surfaces prepared for bonding to the first substrate 100*a*. As shown, the second substrate 100*b* includes a dielectric layer 102*b*, conductive features 112*b* (e.g., conductive base layer 108*b* and conductive surface layer 110*b*) disposed in the dielectric layer 102*b*, and one or more barrier layers (here shown as one barrier layer 104*b*) disposed between the conductive features 112*b* and the dielectric layer 102*b*. In some embodiments, the conductive features 112*b* are formed using the same or a substantially similar process to those described in blocks 10-14 above and further includes recessing a conductive surface layer 110*b* from a surface 114*b* of the surrounding dielectric layer 102*b* at block 15*b*. In some embodiments, conductive features 112*b* may be omitted, only conductive features 108*b* is partially encapsulated by the barrier layer 104*b* and is exposed at the bonding surface of substrate 102*b*.

In other embodiments (not shown), at least one of the to-be-bonded substrates includes conductive features that are substantially co-planar with a field surface of the dielectric layer. In such embodiments, the conductive features of the other to-be-bonded substrate may be substantially co-planar with the dielectric surface. For example, instead of polishing a surface conductive layer 110*a*, 110*b* so that it is protruding or recessed from a surface 114*a*, 114*b* from a substrate 100*a*, 100*b* (e.g., in blocks 15*a* and 15*b* respectively), the surface conductive layer 110*a*, 110*b* is polished so it is co-planar with the surface 114*a*, 114*b* of the substrate 100*a*, 100*b*.

FIG. 1C schematically illustrates a method of hybrid bonding the first substrate 100*a* to the second substrate 100*b*. At block 16, the method includes aligning the respective conductive features 112*a-b* and contacting the substrates 100*a-b* at ambient temperature. Here, contacting the substrates forms a workpiece where the first and second substrates 100*a-b* are attached to one another through direct bonds formed between the dielectric layers without the use of an intervening adhesive. At block 17, the method includes heating the workpiece to a processing temperature of about 150° C. or more, such as about 300° C. or more, to form direct interconnects 112*c* via hybrid bonding of the conductive features 112*a* and 112*b*. For example, hybrid bonding may comprise directly bonding the conductive surface layer 110*a* of the first conductive feature 112*a* to the conductive surface layer 110*b* of the second conductive feature 112*b*.

Figure 2A:
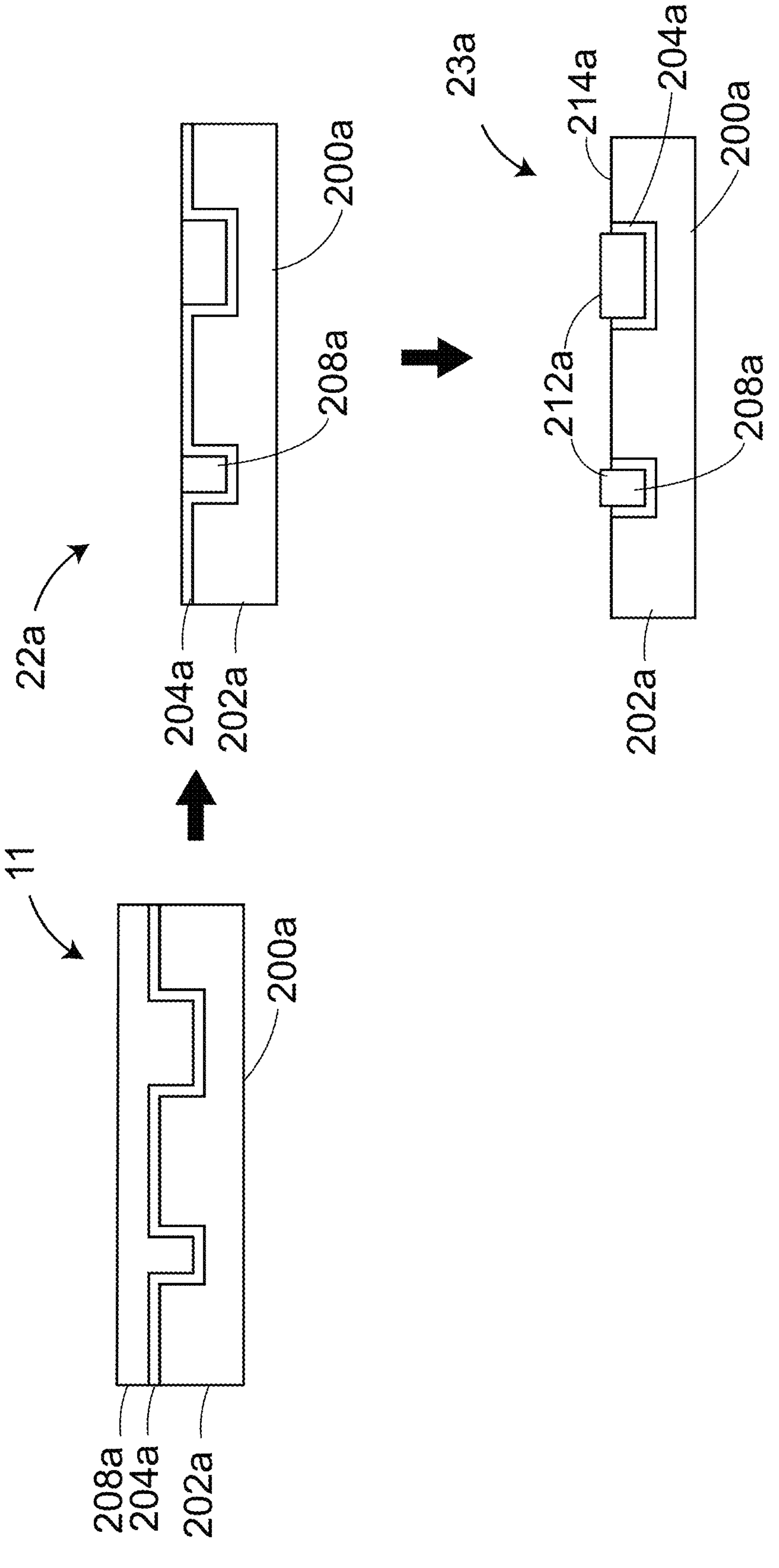
FIGS. 2A-2B schematically illustrate aspects of a method of preparing a substrate for hybrid bonding, according to an embodiment.
Figure 2B:
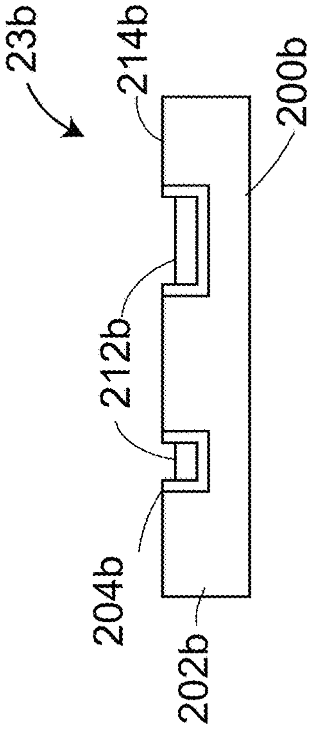
Figure 2C:
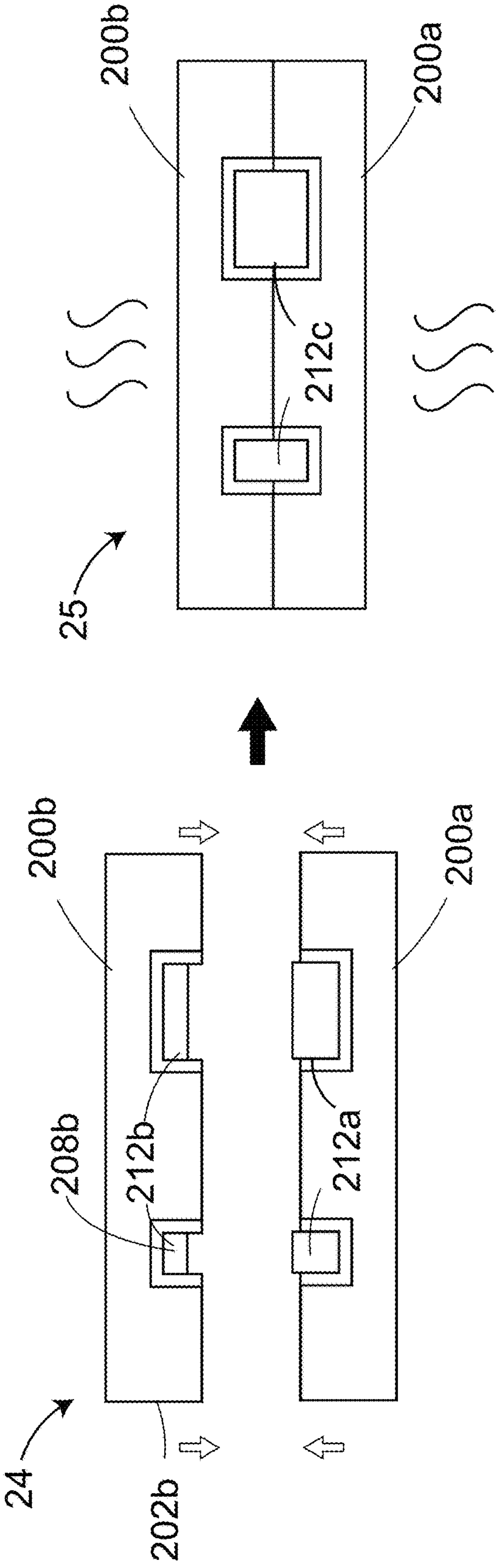
FIG. 2C schematically illustrates a hybrid bonding method using substrates prepared according to the methods described herein, according to an embodiment.

FIGS. 2A-2C collectively illustrate a hybrid bonding method. FIG. 2A illustrates a method of preparing a first substrate 200*a* for hybrid bonding, FIG. 2B illustrates a second substrate 200*b* prepared for bonding to the first substrate 200*a*, and FIG. 2C illustrates aligning, contacting, and bonding of the substrates 200*a* and 200*b*. As shown, first and second substrates 200*a*, 200*b* are substantially similar to the first and second substrates 100*a*, 100*b* described above in relation to block 10 of FIG. 1A, where each substrate 200*a*, 200*b* includes a respective dielectric layer 202*a*, 202*b* having an opening formed therein and barrier layer 204*a*, 204*b* disposed on the dielectric layer 202*a*, 202*b* and lining the opening.

Referring now to FIG. 2A, the method includes forming a conductive feature 212*a* in the first substrate 200*a* by forming a conductive layer 208*a* using the method described in relation to block 11 of FIG. 1A, removing an overburden of the conductive layer 208*a* at block 22*a*, and removing an overburden of the barrier layer 204*a* at block 23*a*. Here, the overburdens of the conductive layer 208*a* and the barrier layer 204*a* may be removed using a two stage polishing process such that the resulting conductive feature 212*a* protrudes above the surface 214*a* of the dielectric layer 202*a*. It is contemplated that blocks 22*a* and 23*a* may incorporate any aspect or combination of aspects of the two stage polishing processes described above in FIG. 1A.

Referring now to FIG. 2B, the second substrate 200*b* includes a conductive feature 212*b* which is recessed from the surface 214*b* of the dielectric layer 202*b*. Here, it is contemplated that the conductive feature 212*b* is formed using a single conductive layer 208*b*, substantially similar to the conductive layer 208*a*, where the recessing is performed using a two-stage polishing process substantially similar to the two-stage polishing process described above in relation to block 15*b* of FIG. 1B. In other embodiments, the conductive features of one or both of the to-be-bonded substrates may be substantially coplanar with the surface 214*b* of the dielectric layer 202*b*. At blocks 24 and 25 (FIG. 2C), the first substrate 200*a* and the second substrate 200*b* are aligned, contacted, and heated to form direct interconnects 212*c* via hybrid bonding, such as described above in relation to FIG. 1C. In some embodiments, the direct interconnects 212*c* comprise a uniform average grain size through the conductive features 212*a*, 212*b* and across the bonding interface therebetween.

It is contemplated that any combination of the methods described above may be used to prepare one or both of the to-be-bonded substrates for hybrid bonding whether or not expressly recited herein. For example, in some embodiments one of the substrates may be prepared according to the methods of FIGS. 1A-1C and the other may be prepared according to the methods of FIGS. 2A-2C. For example, a first substrate 100*a* shown in block 15*a* of FIG. 1A may be bonded to a second substrate 200*b* shown in block 23*b* of FIG. 2B, and hybrid bonding the first substrate 100*a* to the second substrate 200*b* may comprise directly bonding the conductive surface layer 110*a* of the first conductive feature 112*a* to the single conductive layer 208*b* of the second conductive feature 212*b*.

The embodiments discussed above are intended to be illustrative and not limiting. One skilled in the art would appreciate that individual aspects of the devices and methods discussed herein may be omitted, modified, combined, and/or rearranged without departing from the scope of the claimed subject matter. Only the claims that follow are meant to set bounds as to what the claimed subject matter includes.

What is claimed is:

1. A method of bonding substrates, the method comprising:
- forming a first conductive feature on a first substrate, comprising:
  - depositing a conductive base layer on the first substrate, the first substrate having an opening formed therein;
  - recessing the conductive base layer in the opening; and
  - depositing a conductive surface layer on the recessed conductive base layer, wherein an average grain size of the conductive base layer is larger than an average grain size of the conductive surface layer; and
- hybrid bonding the first substrate to a second substrate without an intervening adhesive to connect the first conductive feature on the first substate and a second conductive feature on the second substrate.

2. The method of claim 1, wherein forming the first conductive feature further comprises:
- prior to depositing the conductive surface layer, removing an overburden of the conductive base layer using a first polishing process.

3. The method of claim 2, wherein forming the first conductive feature further comprises:
- removing an overburden of the conductive surface layer using a second polishing process.

4. The method of claim 3, wherein the second polishing process is different from the first polishing process.

5. The method of claim 4, wherein:
- the first polishing process uses a first pad with a first hardness;
- the second polishing process uses a second pad with a second hardness; and
- the first hardness is greater than the second hardness.

6. The method of claim 1, wherein the conductive base layer is recessed by a depth from about 100 nm to about 500 nm.

7. The method of claim 1, wherein the conductive base layer is recessed by a depth of less than about 25 nm.

8. The method of claim 1, wherein the conductive surface layer is deposited using a physical vapor deposition (PVD) process.

9. The method of claim 8, wherein depositing the conductive surface layer further comprises:
- concurrent with the PVD process, maintaining the first substrate at a temperature below about 100° C.

10. The method of claim 8, wherein depositing the conductive surface layer further comprises:
- concurrent with the PVD process, maintaining the first substrate at a temperature below about 50° C.

11. The method of claim 1, wherein the conductive base layer is formed using electroplating.

12. The method of claim 1, wherein the conductive surface layer has a surface roughness of less than about 1 nm root mean square (RMS).

13. The method of claim 1, wherein, prior to the hybrid bonding, the first conductive feature is substantially coplanar with a surface of the first substrate.

14. The method of claim 1, wherein, prior to the hybrid bonding, the first conductive feature protrudes above a surface of the first substrate.

15. The method of claim 1, wherein the second conductive feature is recessed from a surface of the second substrate.

16. The method of claim 1, wherein the second conductive feature is formed by substantially the same method as the first conductive feature.

17. The method of claim 1, wherein:

the hybrid bonding comprises directly bonding the conductive surface layer of the first conductive feature to a single conductive layer of the second conductive feature; and forming the second conductive feature comprises forming the single conductive layer on the second substrate using the same method as used to form the conductive base layer on the first substrate.

18. The method of claim 1, wherein the hybrid bonding comprises:

contacting the first substrate and the second substrate to form a workpiece; and heating the workpiece to a temperature less than about 300° C.

19. A method of bonding substrates, the method comprising:

forming a first conductive feature on a first substrate, comprising:

depositing a conductive base layer on the first substrate, the first substrate having an opening formed therein;

recessing the conductive base layer in the opening; and depositing a conductive surface layer on the recessed conductive base layer, wherein the conductive base layer has a larger grain size than the conductive surface layer; and hybrid bonding the first substrate to a second substrate without an intervening adhesive to connect the first conductive feature on the first substate and a second conductive feature on the second substrate.

20. A method of bonding substrates, the method comprising:

forming a first conductive feature on a first substrate comprising:

depositing a conductive base layer on the first substrate, the first substrate having an opening formed therein;

recessing the conductive base layer in the opening; and depositing a conductive surface layer on the recessed conductive base layer, wherein the first conductive feature protrudes above a surface of the first substrate; and hybrid bonding the first substrate to a second substrate without an intervening adhesive to connect the first conductive feature on the first substate and a second conductive feature on the second substrate.

* * * * *